(12) United States Patent
Nakamura et al.

(10) Patent No.: US 6,231,959 B1
(45) Date of Patent: May 15, 2001

(54) PREPREG OF EPOXY RESIN, HARDENER, AND ORGANODIALKYUREA PROMOTOR

(75) Inventors: Yoshihiko Nakamura; Masahiro Matsumura; Narimasa Iwamoto; Hidetsugu Motobe; Yukio Hatta, all of Kadoma (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/225,500

(22) Filed: Jan. 6, 1999

Related U.S. Application Data

(63) Continuation-in-part of application No. 08/603,990, filed on Feb. 20, 1996, now abandoned.

(30) Foreign Application Priority Data

Feb. 27, 1995 (JP) .................................................... 7-38274
Mar. 29, 1995 (JP) .................................................... 7-71207

(51) Int. Cl.[7] ............................ B32B 17/04; C08L 63/02; C08L 63/04
(52) U.S. Cl. ........................ 428/297.4; 428/413; 525/486; 525/504
(58) Field of Search ................................ 428/413, 297.4; 525/486, 504

(56) References Cited

U.S. PATENT DOCUMENTS

| | | | |
|---|---|---|---|
| 3,386,955 | * 6/1968 | Nawakowski et al. | 528/102 |
| 3,789,071 | * 1/1974 | Babayan . | |
| 3,956,237 | * 5/1976 | Doorakian et al. | 528/93 |
| 4,559,395 | 12/1985 | Jackson | 528/102 |
| 4,604,317 | 8/1986 | Berman et al. | 525/523 |
| 4,954,603 | 9/1990 | Takata et al. | 528/98 |
| 5,021,513 | 6/1991 | Bagga | 525/328.8 |
| 5,064,881 | * 11/1991 | Togashi et al. | 523/443 |
| 5,262,491 | 11/1993 | Jain et al. | 525/396 |

FOREIGN PATENT DOCUMENTS

| | | |
|---|---|---|
| 603131 | * 6/1994 | (CA) . |
| 234289 | * 4/1985 | (CZ) . |
| 258335 | * 8/1988 | (CZ) . |
| 257995 | 3/1989 | (CZ) . |
| 230328 | * 7/1987 | (EP) . |
| 429395 | 5/1991 | (EP) . |
| 603131 | 6/1994 | (EP) . |
| 1260896 | * 1/1972 | (GB) . |
| 60-202117 | 10/1985 | (JP) . |
| 61-220 | * 1/1986 | (JP) . |
| 63-210121 | 8/1988 | (JP) . |
| 63-215734 | * 9/1988 | (JP) . |
| 63-280725 | * 11/1988 | (JP) . |
| 2-145676 | 6/1990 | (JP) . |
| 5-163373 | 6/1993 | (JP) . |
| 975749 | * 11/1982 | (SU) . |

OTHER PUBLICATIONS

Popov et al., "Subsituted bisureas as latent curing agents and accelerators for epoxy resins," Plast. Massy (1985), vol. 7, pp. 43–45.*
Popov et al., Plast. Massy, vol. 7, 1985, pp. 43–45.*
Huang et al., Gaofenzi Xuebao, vol. 3, 1989, pp. 329–336.*
Pearce et al., Journal of Applied Polymer Science, vol. 47, No. 8, 1993, pp. 1401–1409.*

* cited by examiner

Primary Examiner—Robert E. L. Sellers
(74) Attorney, Agent, or Firm—Burns, Doane, Swecker & Mathis, L.L.P.

(57) ABSTRACT

An epoxy resin composition featured in containing, in a matrix of an epoxy resin having more than two epoxy groups in each molecule, a phenolic hardening agent having more than two phenolic hydroxyl groups in each molecule, an organobis(N-dialkylurea) hardening promotion agent, a solvent for the hardening promotion agent, and a guanamine compound, and capable of obtaining a prepreg excellent in the preservation stability and, less causing a solvency erosion (halo phenomenon) due to an infiltration of plating solution along boundaries between a printed copper circuit formed in an inner-layered circuit board and a resin forming the prepreg, is realized.

2 Claims, No Drawings

PREPREG OF EPOXY RESIN, HARDENER, AND ORGANODIALKYUREA PROMOTOR

CROSS REFERENCE TO RELATED APPLICATIONS

This application is a continuation-in-part of cozening application Ser. No. 08/603,990, filed Feb. 20, 1996, abandoned, therethrough claiming priority under 35 U.S.C. §119 to Japanese application nos. 7-38274, filed Feb. 27, 1995, and 7-71207, filed Mar. 29, 1995. The entire content of each of those documents is herein incorporated by reference.

BACKGROUND OF THE INVENTION

This invention relates to an epoxy resin composition employed in, for example, manufacturing a laminated sheet used as a material for a printed wiring board.

DESCRIPTION OF RELATED ART

The laminated sheet used as the material for the printed wiring board has been manufactured by laminating prepregs of such substrate as a glass cloth or the like impregnated with a varnish consisting of an epoxy resin composition and dried, disposing copper foils on the top and bottom of the laminated prepregs, and molding them integral. In such epoxy resin composition for the purpose of making the prepreg and the laminated sheet as well, it has been general that such compound of amines as dicyandiamide is used as a hardening agent. In recent years, on the other hand, continued increments in mounting density of circuit elements are demanding a provision of a laminated sheet more excellent in the heat resistance than known laminated sheets, and a use of a phenolic hardening agent excellent in the heat resistance and effective in shortening required molding time and so on has been investigated. The present inventors have also investigated the epoxy resin compositions for use in making the laminated sheet with the phenolic hardening agent employed, and have discovered that, as has been disclosed in Japanese Patent Application No. 6-29982, a use of imidazoles, tertiary amines or the like as a hardening promotion agent causes a problem to arise in respect of the preservation stability of the prepreg, whereas a use of organic phosphine-containing compound, in particular, such organic phosphine.organic boron complex as tetraphenylphosphonium.tetraphenylborate as the hardening promotion agent improves remarkably the preservation stability of the prepreg.

However, the organic phosphine organic boron complex such as tetraphenylphosphonium.tetraphenylborate is generally incompatible or compatible (soluble) just in trace amount with the epoxy resin and solvents at normal temperatures, and varnishes (epoxy resin compositions) with these hardening promotion agents blended therein have been in opaque state in which the hardening promotion agent is dispersed. Due to this, there has been a problem that the varnish preserved for many hours (for about a week) is caused to become non-homogeneous by the precipitation of dispersed hardening promotion agent so as to render the prepreg to fluctuate in expected properties. In the multilayered printed circuit board, on the other hand, it is required to secure a sufficient adhesion between printed copper circuit formed in inner layered circuit board and a resin forming prepregs. The inner layered circuit board is usually prepared by forming a circuit pattern in electrolytic copper foil bonded on a surface of copper-clad laminate. Usual electrolytic copper foil is provided to be roughened on one surface, referred to as a matte surface, and smoothed on the other surface, referred to as a shiny surface, and the copper foil is bonded at the roughened matte surface onto a laminate in forming the copper clad laminate, so that the top surface of the printed copper circuit formed on the inner layered circuit board will be the smooth shiny surface and the adhesion between the copper circuit and the prepreg resin will tend to be lowered. For this reason, it has been demanded to elevate the adhesion between the copper circuit and the prepreg resin.

Accordingly, it has been attempted in various manners to elevate the adhesion between the copper circuit and the prepreg resin such that, for example, a copper oxide is formed on the surface of the copper circuit to elevate the adhesion, whereby the copper circuit is provided with fine projections inherent to the surface of the copper oxide obtained through an oxidizing treatment of copper, and the copper circuit surface is roughened by such-fine projections to be able to elevate the adhesion. For a measure of forming the copper oxide on the surface of the copper circuit, one referred to as a blackening treatment employing an alkaline aqueous solution containing sodium chlorite has been generally employed.

While the adhesion between the copper circuit and the prepreg resin may be elevated by forming the copper oxide on the surface of the copper circuit, there has arisen such drawback as in the following. That is, as the copper oxide, in particular, cupric oxide is readily soluble in acid, an immersion in a bath of chemical or electrolytic plating solution of the multilayered substrate provided with through-holes for performing a through-hole plating causes cut and exposed copper oxide layers on inner walls of the through-holes of the copper circuit to melt in such acid as hydrochloric acid, so that such solvency erosion as a halo phenomenon will be readily caused to occur due to infiltration of the plating solution along boundaries between the copper circuit and the prepreg resin in the inner walls of the through-holes, and the reliability of the multilayered printed wiring board may have to be lowered.

A prior art related to the present invention is Japanese Patent Laid-Open Publication No. 5-163373 and, as reference art, U.S. Pat. Nos. 4,953,603, 4,559,395, 4,604,317 and 5,262,491 are enumerated.

SUMMARY OF THE INVENTION

The present invention has been suggested in view of the foregoing state of art, and its object is to provide an epoxy resin composition containing a phenolic hardening agent, which composition can manufacture a prepreg excellent in the preservation stability, and prevent the hardening promotion agent from precipitating even after the preservation for many hours in the form of varnish. It is a further object to obtain an epoxy resin composition which allowing the prepreg less causing the solvency erosion (halo phenomenon) due to the infiltration of the plating solution along the boundaries between the copper circuit formed in the inner layered circuit board and the prepreg resin to be obtainable.

According to the present invention, the above objects can be realized by means of an epoxy resin prepreg for use in printed wiring board, the prepreg comprising a substrate, and an epoxy resin composition, the composition comprising (a) an epoxy resin, (b) a hardening agent, (c) a hardening promotion agent, and (d) a solvent for dissolving the hardening promotion agent; wherein the hardening agent of (b) of 100 parts by weight contains 95 to 100 parts by weight of multifunctional phenols having more than two phenolic hydroxyl groups in each molecule; and the hardening promotion agent of (c) is a compound represented by the following general formula (1):

(1)

in which "n" denotes an integer of 1–4 and R denotes a monohydric organic group; the substrate being impregnated with the composition, thereafter heated and dried.

Further objects and advantages of the present invention shall be clarified as the description of the invention advances in the followings with reference to preferred embodiments.

While the present invention shall now be detailed with reference to specific embodiments, it should be appreciated that the intention is not to limit the invention only to the embodiments but rather to include all alterations, modifications and equivalent arrangements possible within the scope of appended claims.

DETAILED DESCRIPTION OF THE PREFERRED EMBODIMENTS

The epoxy resin employed in the present invention may be any compound having more than two epoxy groups in each molecule, and may even be a mixture. As typical ones of such resin, bisphenol A type epoxy resin, brominated bisphenol A type epoxy resin, bisphenol F type epoxy resin, cresol novolak type epoxy resin, trifunctional type epoxy resin and the like can be employed, but the use is not limited only to them.

For the phenolic hardening agent employed in the present invention, any compound having more than two phenolic hydroxyl groups in each molecule or even a mixture of such compounds may be used. Typical phenolic hardening agent will be phenol novolak, cresol novolak and the like, but the use may not be limited thereto.

The hardening promotion agent employed in the present invention is a compound represented by the foregoing general formula (1), practical examples of which will be such compounds as shown by later described general formulas (7)–(11), and these compounds may be used respectively alone or in combination of two or more. When a compound represented by the formula (7) or (8) is employed, in particular, obtainable prepreg is made excellent in the preservation stability, to be preferable.

The solvent also employed in the present invention is one for dissolving the hardening promotion agent, practical examples of which will be such alcoholic solvents as methanol, methoxypropanol and so on, water and the like, while it is not required to be limited to them. Further, it is preferable that the particular solvent is employed concurrently with other solvent or solvents for dissolving the epoxy resin and hardening agent, examples of which other solvent will be such solvents of ketones as methyl ethyl ketone and so on.

While the epoxy resin composition for use in the laminated sheet according to the present invention contains as essential components the foregoing epoxy resin, hardening agent, hardening promotion agent and solvent, the composition may contain such further component or components as a phenoxy resin, filler additive or the like, as occasion demands, to an extent of not impairing the objects of the invention. Further, while the phenoxy resin is effective to render the melting viscosity of obtainable prepreg to be readily adjustable, an excess content thereof impairs the mechanical strength, in particular, bending strength of the laminated sheet, it is preferable that the phenoxy resin is used in a range of 3 to 10 parts by weight with respect to the sum 100 parts by weight of the epoxy resin and hardening agent.

Accordingly, the presence in the epoxy resin composition of the hardening agent represented by the general formula (1) is effective to allow the prepreg excellent in the preservation stability to be obtainable, and to prevent the hardening promotion agent from precipitating even when the varnish is preserved for many hours because of a high solubility in the solvent.

In the present invention, further, it is also important that the compound of guanamines represented by a following general formula (4) is contained, at a content preferably of 0.2 to 3.0 parts by weight with respect to the sum 100 parts by weight of the epoxy resin and phenolic hardening agent. This is for the reason that the content below 0.2 part by weight renders the effect of reducing the halo phenomenon not remarkable any more, and a content above 3.0 parts by weight causes the rate of moisture absorption of hardened resin obtained to be increased, tending to deteriorate the moisture-absorbing, heat resistance and electric characteristics of resultant multilayered printed wiring board. For the compound of guanamines represented by the following general formula (2), it is possible to employ such compound (guanamine) as represented by a following structural formula (3), such compound (benzoguanamine) as represented by a following structural formula (4), such compound (acetoguanamine) as represented by a following structural formula (5), such compound as represented by a following structural formula (6) and the like, while they may be employed alone or in combination:

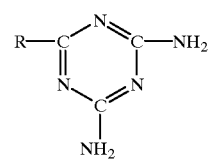
(2)

(wherein R denotes a monohydric organic group.)

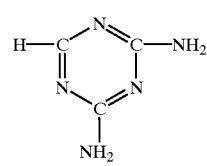
(3)

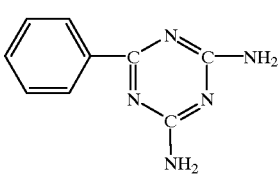
(4)

-continued

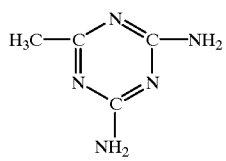

(5)

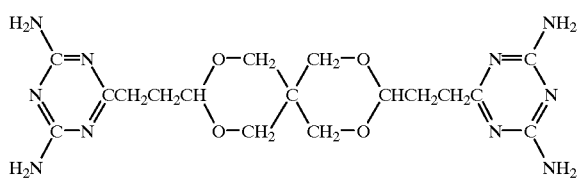

(6)

Further in the present invention, it is optimum to have dicyandiamide also contained in the composition, at a content set to be 0.1 to 1.0 parts by weight with respect to the sum 100 parts by weight of the epoxy resin and phenolic hardening agent, so as to be able to more effectively reduce the halo phenomenon. With the content of dicyandiamide less than 0.1 parts by weight renders the effect insufficient, while a content more than 1.0 parts by weight causes the rate of moisture absorption of obtainable hardened resin increased, tending to have the moisture-absorbing, heat resistance and electric characteristics of the resultant multilayered printed wiring board to be deteriorated.

As a solvent, methoxypropanol as well as methyl ethyl ketone for dissolving the epoxy resin, hardening agent and phenoxy resin are used at a desired rate.

In this case, the phenoxy resin is dissolved in methyl ethyl ketone to be an initial solution, and then the epoxy resin and hardening agent are mixed and dissolved in this initial solution to be an intermediate solution. Next, a mixture of methoxypropanol as the solvent with a hardening promotion agent is added to the intermediate solution of methyl ethyl ketone and they are mixed to prepare an epoxy resin composition (varnish).

A glass cloth (a product by a Japanese manufacturer ASAHI SWIVEL, Article #7628W) was impregnated with the epoxy resin composition (varnish) prepared as in the above, they were dried at 150° C., and a prepreg of a resin content of about 45% by weight and a thickness of about 0.2 mm was thereby prepared. Drying time in this event was set for every epoxy resin composition so that the melting viscosity at 130° C. (the lowest melting viscosity when measured at 130° C.) of resin component at a stage when the prepreg is attained will be in a range of 300 to 500 poise. With respect to this epoxy resin composition (varnish) thus obtained, the transparency of the varnish right after being prepared and occurrence of sediments in the varnish after 7 days preservation were evaluated, and also the preservation stability of the prepreg thus obtained was evaluated, the result of which was as shown in a following table.

Concrete testing process for respective items of the evaluation was as described below.

Transparency of Varnish Right After Being Prepared:

Appearances of the epoxy resin composition (varnish) right after being prepared were evaluated with visual observation and discriminated whether transparent or opaque.

Occurrence of Sediments in Varnish Preserved for 7 Days:

After preservation for seven days of the epoxy resin composition (varnish) in an atmosphere of 25° C., the occurrence of sediments in the varnish was evaluated with visual observation and discriminated whether present or absent.

Preservation Stability of Prepreg:

The prepreg was preserved in an isothermic bath at 40° C., the melting viscosity at a temperature of 130° C. was measured at every fixed time interval to investigate its-variation with time, and the number of days for which the rate of change from an initial value was below 50% (except the day on which the rate exceeded 50%) was regarded as the number of days preservable at 40° C. The melting viscosity was measured by means of a downward-movement type flowmeter with respect to a resin component adhering to but removed as crumpled from the prepreg [Rate of change in melting viscosity (%)=(melting viscosity after time elapsed—initial melting viscosity)×100/(initial melting viscosity)].

Measuring Manner for Glass Transition Temperature:

A laminate obtained by stacking three prepregs obtained and molding the stack as held between metal plates through release films under conditions of a pressure 40 Kg/cm$^2$ and a temperature of 170° C. for 90 minutes was employed as a test member, thermal dispersion in dynamic viscoelastic properties of which was measured, and a peak temperature of tan δ obtained was regarded as the glass transition temperature. Measuring Manner for "Halo" Characteristics:

An inner-layered circuit board was prepared with use of a copper-clad laminate of glass cloth substrate (a product by MATSUSHITA ELECTRIC WORKS, Article No. 1766) of 0.7 mm thickness and having copper foils of 70 mm thickness on both sides of the laminate, the foils being bonded on their roughened (matte) surface side to the laminate, and this inner-layered circuit board was then dipped for 2 minutes in an aqueous solution of sodium chlorite and adjusted at 95° C., to have exposed surfaces of the copper circuit on the inner-layered circuit board subjected to an oxidation treatment. Then, the inner-layered circuit board was rinsed and dried. Thereafter, three prepregs were stacked on each of the top and bottom of the circuit board, copper foils of 18 μm were further stacked on its outer sides, the stack thus obtained was held between metal plates and was molded under such conditions as a pressure of 40 Kg/cm$^2$ and a temperature of 170° C. for 90 minutes, and a multilayered substrate was obtained. Then, this multilayered substrate was subjected to a through-hole working with a drill bit of 0.4 mmφ, under the conditions of a rotating speed of 80,000 rpm and a feeding rate of 1.6 m/min., and the thus obtained substrate having through-holes was used as a test member. The test member was immersed for 60 minutes in an aqueous solution of hydrochloric acid of 17.5%, the copper foils of 18 μm on the surfaces were removed through an etching, thereafter a state of "halo" occurrence was observed by a microscope of 100× magnification, and an extent of halo (infiltrating size of the solution from the wall surface of the through-hole) was measured, which measurement was used as a numerical value denoting the "halo" characteristics.

Measuring Manner for the Rate of Moisture Absortion:

A laminate obtained by stacking eight prepregs into a stack and molding this stack as held between the metal plates through releasing films and under the conditions of a pressure of 40 Kg/cm$^2$ and a temperature of 170° C. for 90 minutes was used as a testing member, which was subjected to a moisture absorbing treatment for seven days in a constant temperature and constant moisture bath of 85° C. and 85%. Weight of the testing member before and after the moisture absorbing treatment was measured, and the rate of moisture absorption was calculated.

Measuring Manner for Oven Heat Resistance:

The multilayered substrate used for the "Halo" measurement but before being through-hole-worked was cut into sample pieces of 50×50 mm, four of which sample pieces were placed in a constant temperature bath kept at 230° C., and thereafter the presence of absence of blister was evaluated with respect to the copper foil and so on. The number of the samples in which the blister has occurred was obtained, and was made as a value denoting the oven heat resistance.

Measuring Manner for Minimum Required Heating Time for Molding:

Sample laminates were obtained through the molding at 170° C. and respectively for different periods of 20, 40, 60, 90, 120 and 150 minutes, in accordance with the foregoing manner of measuring the glass transition temperature, the thus obtained laminates were respectively subjected to the measurement of the glass transition temperature, and the shortest time at which the glass transition temperature of the respective laminates has shown no remarkable change even after further heating of the respective laminates beyond the above molding period was regarded as the value of the minimum required heating time for the molding with respect to each laminate. For this measurement of the minimum required heating time for molding, only the laminates obtained through such Example 2 and Comparative Examples 4–6 as described in the following examples were employed.

EXAMPLES 1–9 & COMPARATIVE EXAMPLES 1–13:

Examples 1–9 as well as Comparative Examples 1–13 were executed under the conditions shown in the following tables, and the foregoing evaluation was made with respect to obtained varnish, prepreg and so on, as a result of which it has been confirmed that the prepreg obtained through the respective Examples in which a resin composition in the form of a varnish comprising (a) an epoxy resin, (b) a hardening agent, (c) a hardening promotion agent represented by the foregoing general formula (1) was employed have shown more preservable days of prepreg and less sedimentation of varnish, and resultant laminates have been high in the glass transition temperature and excellent in the heat resistance.

In respect of Comparative Examples 1–5 employing various hardening promotion agents other than those represented by the general formula (1), it has been confirmed that resultant prepregs show less preservable days and liability to opaqueness of the varnish.

Further, in respect of Comparative Examples 6–8 employing dicyandiamide as main hardening agent which has been widely used in manufacturing the epoxy resin prepregs for use in the printed wiring board, it has been confirmed that their resultant prepregs are lower in the glass transition temperature, inferior in the heat resistance and longer in the minimum required heating time for molding to be deteriorated in the productivity, than in the case of respective Examples 1–9 employing multifunctional phenols having more than two phenolic hydroxyl groups in each molecule.

In the case of Comparative Examples 9–11 using concurrently dicyandiamide and multifunctional phenols having more than two phenolic hydroxyl groups in each molecule, further, the multifunctional phenols being at a ratio of less than 95 parts by weight with respect to 100 parts by weight of the hardening agent, it has been confirmed that their prepregs show less preservable days than in the case of Examples 1–9.

In the case of Comparative Examples 12 and 13 using a solvent which is not the one for dissolving the hardening promotion agent, it has been confirmed that obtained varnish is liable to become opaque and also to cause the sedimentation. Further Comparative Examples 1, 2, 12 and 13 in which the prepregs are manufactured with a varnish liable to cause the sedimentation have been confirmed to result in prepregs involving impregnation irregularity of particles of the hardening promotion agent, so as to be deteriorated in the appearance and also in the oven heat resistance, in contrast to the respective Examples 1–9.

In view of the above respects, it is seen that the resultant prepreg is deteriorated in either one of the preservation stability of prepreg, the preservation stability of varnish, the heat resistance of laminate or the productivity in molding, in an event where such hardening promotion agent as tetraphenylphosphonium.tetraphenylborate, 2-ethyl-4-methyl imidazole, 1,8-diazabicyclo(5,4,0)undecene-7 or the like which has been generally used in manufacturing the epoxy resin prepregs for use in the printed circuit board is employed; or in an event where dicyandiamide is used as the main hardening agent, or where no solvent for dissolving the hardening promotion agent is contained. When on the other hand such hardening agent as multifunctional phenols having more than two phenolic hydroxyl groups in each molecule, the hardening promotion agent represented by the general formula (1), and the solvent for dissolving the hardening promotion agent are selected from a number of various hardening agents, hardening promotion agents and solvents, and are used as combined as in the present invention, it has been confirmed that there can be attained excellent effect in the preservation stability of prepreg, preservation stability of varnish, heat resistance of laminate and productivity upon molding.

For the respective components, following materials have been employed:

(a) Epoxy Resin:
   1—ESB400 (a product by SUMITOMO KAGAKU), tetrabromobisphenol
     A type epoxy resin (epoxy equivalent weight (EEW)=400)
   2—DER500 (a product by DAW CHEMICAL), brominated bisphenol A type epoxy resin (EEW=500)
   3—YDCN702P (a product by TOHTO KASEI), multifunctional, mainly more than trifunctional cresol novolak type epoxy resin (EEW=200)

(b) Hardening Agent:
   1—Phenol novolaks—TAMANORL 752 (a product by ARAKAWA KAGAKU), hydroxyl group equivalent weight=abt. 105
   2—dicyandiamide (c) Hardening Promotion Agent:
   1—Compounds of a melting point about 200° C. and represented by a following formula (7):

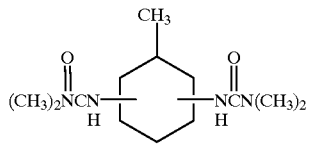

(7)

or represented by a following general formula (9):

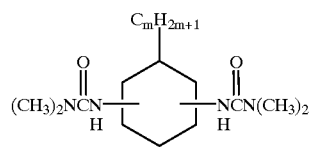

(9)

wherein "m" denotes 0 or an integer 1–3.

2—Compounds of a melting point about 190° C. and represented by a following formula (8):

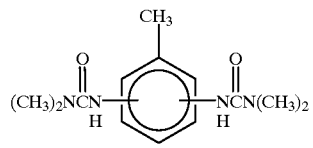

(8)

or represented by a following general formula (10):

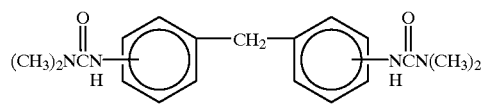

(10)

wherein "p" denotes 0 or an integer 1–3, or by a following formula (11):

(11)

(CH$_3$)$_2$NCN—⟨⟩—CH$_2$—⟨⟩—NCN(CH$_3$)$_2$
      H                              H
      ‖                              ‖
      O                              O

3—Tetraphenylphosphonium.tetraphenylborate
4—2-ethyl-4-methyl imidazole (2E4MZ)
5—1,8-diazabicyclo(5,4,0)undecene-7
6—Salt of 1,8-diazabicyclo(5,4,0)undecene-7 and phenol novolak, reacted at weight ratio of 40:60

(d) Solvent:
  1—Methyl ethyl ketone
  2—Methoxypropanol (e) Others:
  Phenoxy resin PKHH (a product by UNION CARBIDE), average molecular weight by GPC: Mw=42600, Mn=11200

|  | EX.1 | EX.2 | EX.3 | EX.4 | EX.5 | EX.6 | EX.7 | EX.8 | EX.9 |
|---|---|---|---|---|---|---|---|---|---|
| Epoxy Resin: | 1 + 2 | 2 + 3 | 2 + 3 | 2 + 3 | 2 + 3 | 2 + 3 | 2 + 3 | 2 + 3 | 2 + 3 |
| Type |  |  |  |  |  |  |  |  |  |
| Amt. | 56.1 + 24.1 | 53.7 + 23.0 | 53.7 + 23.0 | 53.7 + 23.0 | 53.7 + 23.0 | 53.7 + 23.0 | 53.7 + 23.0 | 53.7 + 23.7 | 53.7 + 23.0 |
| Hard. Agt.: Type | 1 | 1 | 1 | 1 | 1 | 1 | 1 + 2 | 1 + 2 | 1 + 2 |
| Amt. | 19.8 | 23.3 | 23.3 | 23.3 | 23.3 | 23.3 | 23.3 + 0.5 | 23.3 + 0.5 | 23.3 + 0.5 |
| Guanamine | Nil | Nil | Nil | 0.5 | Nil | Nil | Nil | 0.5 | Nil |
| Benzoguanamine | Nil | Nil | Nil | Nil | 0.5 | 2.5 | 0.5 | Nil | 0.5 |
| Hard. Prom. Agt.: Type | 1 | 1 | 2 | 1 | 1 | 1 | 1 | 1 | 1 |
| Amt. | 0.2 wt % | 0.2 wt % | 0.2 wt % | 0.2 wt % | 0.2 wt % | 0.2 wt % | 0.2 wt % | 0.2 wt % | 0.2 wt % |
| Phenoxy Resin: Amt. | 6 phr | 6 phr | 6 phr | 6 phr | 6 phr | 6 phr | 6 phr | 6 phr | Nil |
| Solvent - |  |  |  |  |  |  |  |  |  |
| 1: | 33.0 | 33.0 | 33.0 | 33.0 | 33.0 | 33.0 | 33.0 | 33.0 | 66.0 |
| 2: | 33.0 | 33.0 | 33.0 | 33.0 | 33.0 | 33.0 | 33.0 | 33.0 | 0 |
| Equiv. Wt. (Ep/OH): | 1/1 | 1/1 | 1/1 | 1/1 | 1/1 | 1/0.5 | 1/1 | 1/0.5 | 1/1 |
| Preservable Days of Prepreg: | 35 | 30 | 30 | 30 | 30 | 30 | 30 | 30 | 30 |
| Transparency of Varnish | Transp. | Transp. | Transp. | Transp. | Transp. | Transp. | Transp. | Transp. | Transp. |
| Sediment in Varn. aft. preserv. | Absent | Absent | Absent | Absent | Absent | Absent | Absent | Absent | Absent |
| Glass Trns. Tmp. (° C.): | 145 | 141 | 141 | 141 | 141 | 141 | 141 | 141 | 141 |
| Size of Halo ($\mu$m): | 900 | 900 | 900 | 500 | 500 | 500 | 300 | 300 | 300 |
| Efficiency of Moist. Absp. (%): | 0.55 | 0.50 | 0.50 | 0.50 | 0.50 | 0.50 | 0.50 | 0.50 | 0.48 |
| Oven Heat. Resist. | 0 | 0 | 0 | 0 | 0 | 0 | 0 | 0 | 0 |
| Min. Req. Heat Time for Molding: | — | 40 | — | — | — | — | — | — | — |

|  | COMP. EX.1 | COMP. EX.2 | COMP. EX.3 | COMP. EX.4 | COMP. EX.5 | COMP. EX.6 | COMP. EX.7 | COMP. EX.8 | COMP. EX.9 | COMP. EX.10 | COMP. EX.11 | COMP. EX.12 | COMP. EX. 13 |
|---|---|---|---|---|---|---|---|---|---|---|---|---|---|
| Epxy. Rsn. Typ. | 1 + 2 | 2 + 3 | 2 + 3 | 2 + 3 | 2 + 3 | 2 + 3 | 2 + 3 | 2 + 3 | 2 + 3 | 2 + 3 | 2 + 3 | 2 + 3 | 2 + 3 |
| Amt. | 56.1 + 24.1 | 53.7 + 23.0 | 53.7 + 23.0 | 53.7 + 23.0 | 53.7 + 23.0 | 53.7 + 23.0 | 53.7 + 23.0 | 53.7 + 23.0 | 53.7 + 23.0 | 53.7 + 23.0 | 53.7 + 23.0 | 53.7 + 23.0 | 53.7 + 23.0 |

-continued

| | COMP. EX.1 | COMP. EX.2 | COMP. EX.3 | COMP. EX.4 | COMP. EX.5 | COMP. EX.6 | COMP. EX.7 | COMP. EX.8 | COMP. EX.9 | COMP. EX.10 | COMP. EX.11 | COMP. EX.12 | COMP. EX.13 |
|---|---|---|---|---|---|---|---|---|---|---|---|---|---|
| Hrd. Agt. Typ. | 1 | 1 | 1 | 1 | 1 | 2 | 2 | 2 | 1 + 2 | 1 + 2 | 1 + 2 | 1 | 1 |
| Amt. | 19.8 | 23.3 | 23.3 | 23.3 | 23.3 | 23.3 | 4.5 | 2.3 | 23.3 + 1.5 | 23.3 + 1.5 | 23.3 + 2.5 | 23.3 | 23.3 |
| Guanamine | Nil | Nil | Nil | Nil | Nil | Nil | Nil | Nil | Nil | 0.5 | Nil | Nil | Nil |
| Benzoguanamine | Nil | Nil | Nil | Nil | Nil | Nil | Nil | Nil | 0.5 | Nil | 0.5 | Nil | Nil |
| Hrd. Prm. Agt. Typ. | 3 | 3 | 4 | 5 | 6 | 1 | 1 | 4 | 1 | 1 | 1 | 1 | 2 |
| Amt. (wt %) | 0.2 | 0.2 | 0.2 | 0.2 | 1.0 | 0.2 | 0.2 | 0.2 | 0.2 | 0.2 | 0.2 | 0.2 | 0.2 |
| Phnxy. Rsn. Amt. (phr) | 6 | 6 | 6 | 6 | 6 | 6 | 6 | 6 | 6 | 6 | 6 | 6 | 6 |
| Slvt. | | | | | | | | | | | | | |
| 1: | 33 | 33 | 33 | 33 | 33 | 33 | 33 | 33 | 33 | 33 | 33 | 66 | 66 |
| 2: | 33 | 33 | 33 | 33 | 33 | 33 | 33 | 33 | 33 | 33 | 33 | 0 | 0 |
| Eqv. wt. | 1/1 | 1/1 | 1/1 | 1/1 | 1/1 | 1/0.5 | 1/1 | 1/0.5 | 1/1.3 | 1/1.3 | 1/1.5 | 1/1 | 1/1 |
| Prsv. Days of prepreg | 45 | 43 | 5 | 5 | 5 | 30 | 30 | 15 | 13 | 10 | 3 | 30 | 30 |
| Transp. of Varnish | Opaq. | Opaq. | Trnsp. | Trnsp. | Trnsp. | Trnsp. | Trnsp. | Trnsp. | Trnsp. | Trnsp. | Trnsp. | Opaq. | Opaq. |
| Sediment in Varnish | Prsnt. | Prsnt. | Absnt. | Absnt. | Absnt. | Absnt | Absnt. | Absnt. | Absnt. | Absnt. | Absnt. | Prsnt. | Prsnt. |
| Glass Trnsf. Tmp. (° C.) | 145 | 141 | 141 | 142 | 142 | 132 | 135 | 132 | 141 | 141 | 141 | 141 | 141 |
| Size of Halo ($\mu$m) | 900 | 900 | 900 | 900 | 900 | 300 | 300 | 300 | 250 | 250 | 230 | 900 | 900 |
| Eff. of Mst. Absp. (%) | 0.55 | 0.5 | 0.5 | 0.6 | 0.6 | 0.8 | 1.1 | 0.8 | 0.7 | 0.7 | 1 | 0.5 | 0.5 |
| Oven Heat Resist | 4 | 4 | 0 | 0 | 0 | 2 | 3 | 2 | 1 | 1 | 3 | 4 | 4 |
| Min. Req. Heat. Time for Molding | — | — | 40 | — | — | 120 | 120 | 120 | — | — | — | — | — |

While in the foregoing Examples and Comparative Examples there have been shown examples of the components, the composition according to the present invention are not limited to these examples but various other materials and other compounds can be employed.

We claim:

1. An epoxy resin prepreg for use in printed wiring board, the prepreg comprising a substrate, and an epoxy resin composition, the composition comprising (a) an epoxy resin, (b) a hardening agent, (c) a hardening promotion agent, and (d) a solvent for dissolving the hardening promotion agent;

wherein the hardening agent of (b) of 100 parts by weight contains 95 to 100 parts by weight of phenol novolaks, and the hardening promotion agent of (c) is a compound represented by a following formula (9):

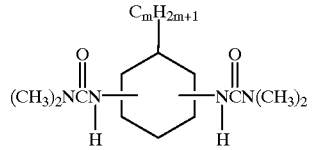

(9)

in which "m" denotes one of 0 and an integer of 1–3;
the substrate being impregnated with the composition, thereafter heated and dried.

2. The prepreg according to claim 1 wherein the hardening promotion agent of (c) is a compound represented by a following formula (7):

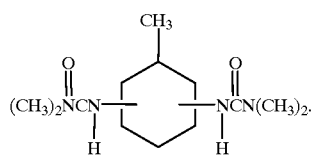

(7)

* * * * *